United States Patent [19]
Carroll

[11] Patent Number: 6,032,359
[45] Date of Patent: Mar. 7, 2000

[54] METHOD OF MANUFACTURING A FEMALE ELECTRICAL CONNECTOR IN A SINGLE LAYER FLEXIBLE POLYMERIC DIELECTRIC FILM SUBSTRATE

[76] Inventor: Keith C. Carroll, 6 Berney Drive, Caledon East, Ontario, Canada, L0N 1E0

[21] Appl. No.: 08/947,637

[22] Filed: Oct. 9, 1997

[30] Foreign Application Priority Data

Aug. 21, 1997 [CA] Canada .................................. 2213590

[51] Int. Cl.⁷ .................................................. H01R 43/04
[52] U.S. Cl. .............................. 29/881; 29/845; 29/842; 29/846; 439/67; 439/75
[58] Field of Search ........................... 29/881, 846, 845, 29/842, 825, 33; 439/67, 77, 592, 75

[56] References Cited

U.S. PATENT DOCUMENTS

| | | | |
|---|---|---|---|
| 4,347,552 | 8/1982 | Pearcy et al. | 361/398 |
| 4,700,214 | 10/1987 | Johnson . | |
| 4,908,336 | 3/1990 | Mouissie | 439/496 |
| 4,950,173 | 8/1990 | Minemura et al. | 439/82 |
| 5,172,472 | 12/1992 | Lindner et al. | 29/845 |
| 5,278,385 | 1/1994 | Gerome et al. | 219/121.68 |
| 5,372,512 | 12/1994 | Wilson et al. | 439/67 |
| 5,456,616 | 10/1995 | Fuerst et al. | 439/620 |
| 5,493,230 | 2/1996 | Swart et al. | 324/754 |
| 5,548,488 | 8/1996 | Hansen | 361/815 |
| 5,826,330 | 10/1998 | Isoda et al. | 29/852 |

*Primary Examiner*—Lee Young
*Assistant Examiner*—Minh Trinh

[57] ABSTRACT

A method of making a wiping connection between a male connector and a female connector in a single layer of a flexible polymeric dielectric film substrate having a thickness of less than 0.012 inches is disclosed. A laser directs a beam towards the substrate cutting a smooth pattern through the substrate to define a passage extending through the substrate and providing at least one resilient foldable flap normally closing the passage through the substrate. Next an electrically conductive material is coated on the flexible polymeric dielectric film substrate including a circuit trace providing an electrical contact land area surrounding the pattern extending over the foldable flap to form the female connector. The male connector is then inserted into the female connector through the flexible polymeric dielectric film substrate at the pattern, deflecting the foldable flap and conductive coating into wiping electrical and mechanical engagement with the male connector to secure the male connector to the substrate in electrical contact with the trace circuit.

12 Claims, 3 Drawing Sheets

METHOD OF MANUFACTURING A FEMALE ELECTRICAL CONNECTOR IN A SINGLE LAYER FLEXIBLE POLYMERIC DIELECTRIC FILM SUBSTRATE

BACKGROUND OF THE INVENTION

1. Technical Field of the Invention

The present invention relates to an electronic flexible circuit connector and, in particular, to a flexible circuit connector formed through a single layer of flexible polymeric film substrate without the use of solder to mechanically fasten and electrically connect a male connector to the substrate.

2. Description of Related Art

A flexible circuit includes a flexible dielectric substrate having conductive inks printed on the substrate surface to define circuit traces. The dielectric substrate typically comprises a polymeric film and in particular a polyimide film. Components are attached to be flexible circuit with component connectors either passing through apertures in the flexible circuit or being seated on land pads etched into the substrate. The electrical contacts of these components are typically soldered in electrical contact with the aperture or the land to mechanically secure the component to the flexible circuit.

The characteristics of the dielectric substrate permit a flexible bending of the substrate to accommodate locating the flexible circuit in applications where a non-rigid printed circuit is required. However, care must be taken in shaping the dielectric film or the production of any holes through the material since any irregularities in the edges of the dielectric film can easily lead to tearing of the flexible circuit damaging the circuit beyond repair. Consequently, connections made with the circuit traces to interface devices operating with the flexible circuit are typically made by running the traces to an edge surface of the flexible connector and attaching a ribbon connector to the traces by soldering leads in the ribbon connector to the traces. This is a factor to be considered when creating a circuit trace layout design for the flexible circuit. The ribbon connectors typically have a pin socket at the other end for attachment to the interface device.

While the use of through hole connection of terminals to dielectric substrates has been achieved with printed circuit boards, it should be understood that these printed circuits typically comprise several layers of polyimide film separated by layers of insulation resulting in a rigid substrate having a thickness in the order of 0.062 thousands of an inch. One such through hole connector is disclosed in U.S. Pat. No. 5,172,472 issued Dec. 22, 1992 to Linder et al. where a multi-layer rigid printed circuit board fabrication method is disclosed. In this patent, a hexagonal shaped pin is forced through several layers of a mylar film material having intermittent insulation layers and a printed circuit core or substrate. The hexagonal shaped pin has a diameter greater than the diameter of the layers of mylar material and equal to the diameter of the core of the printed circuit core. As the pin is forced through the openings, its cuts and deforms the flexible mylar layers into wiping contact with the pin. In order to cut into the mylar layers without tearing the layers, the rigid core and intermittent layers of insulation between the mylar layers are required, otherwise it would not be probable to obtain a wiping electrical contact.

U.S. Pat. No. 5,548,488 issued Aug. 20, 1996 to Scott Hansen discloses use of an electrical lamp socket mounted to a rigid substrate with a flexible circuit sandwiched between the socket and the rigid substrate. The flexible circuit carries electrical traces having conductive terminals with central apertures formed having a slightly smaller diameter than corresponding aligned apertures in the rigid supporting substrate. The lamp socket includes two elongate terminal pins which pass through the aligned apertures of the flexible circuit and the rigid substrate to deform the aperture of the flexible circuit against the rigid substrate. Mechanical fastening of the lamp socket component is made between the terminal pins of the lamp socket component and rigid substrate. Due to the sensitivity of the dielectric flexible substrate to tearing, the supporting substrate is necessary in order to mechanically secure the terminal pins and two prevent tearing of the flexible circuit.

There is a need to develop a direct connection of a terminal to a flexible circuit that does not require a solder paste to mechanically secure the terminal to the flexible circuit, ensures good electrical contact with the circuit and allows for increased circuit trace design flexibility over the use of ribbon connectors.

SUMMARY OF THE INVENTION

The present invention relates to a method for interconnecting a terminal pin or male connector to a single layer of a polymeric dielectric film flexible substrate used in a flexible circuit. The flexible substrate has a female connector defined by a pattern smoothly cut from the flexible substrate having at least one resilient flap normally restricting passage through the flexible film and deflecting or folding to receive the pin terminal in wiping engagement therewith. A coating of electrically conductive material is located on the flexible substrate having an electrical contact land area surrounding the pattern and extending over the foldable flap. When the male terminal or connector is inserted into the female connector through the flexible film substrate at the pattern, the flap deflects into wiping and mechanical engagement with the male connector to solely secure the male connector to the substrate in electrical contact with the electrically conductive material.

In accordance with the method of the present invention, a laser is used to cut the pattern into the flexible substrate material. By using a laser, a smooth non-jagged edge for the pattern is achieved. The pattern preferably results in three or more foldable flaps. Preferred patterns are the shape of a star resulting in five or six flaps and the shape of an asterisk resulting in eight flaps. In these latter two preferred patterns, the flaps resemble pie shaped slices. It is within the realm of the present invention to have the tips of the pie shaped slices removed so at the flaps restrict only a portion of the passage through the female connection. By smoothly cutting the pattern into the flexible film substrate, the film has no weak stress points which can result in tears when the male connector is inserted into the passage. As a result, the resilient flexible characteristic of the film material used in the dielectric substrate is preserved in the flaps allowing or the flaps to mechanically and electrically engage the male connector.

In the preferred embodiment of the present application a cylindrical shaped pin is disclosed. However, it is envisaged that improvements in the wiping and mechanical engagement between the flap and pin can be achieved by puttering the shape of the pin to correspond to the pattern laser cut into the substrate. Thus, triangular, square or other shaped pin connectors can be used that correspond to the pattern cut into the substrate.

In accordance with one aspect of the present invention there is provided a method of manufacturing a female electrical connector in a single layer of a flexible polymeric film substrate of a flexible circuit ready for mechanically securing a male connector directly to the film substrate in electrical contacting relation with a circuit trace. The method comprises the steps of:

directing a laser beam towards the flexible polymeric film substrate to cut a smooth pattern through the film substrate defining at least one resilient foldable flap normally restricting passage through the flexible film and adapted to deflect to receive the male connector in wiping engagement therewith; and, coating an electrically conductive material on the substrate including a circuit trace having an electrical contact land area surrounding the pattern and extending over the foldable flap.

In accordance with another aspect of the present invention there is provided a female electrical connector for a single layer of a flexible polymeric film substrate of a flexible circuit ready for mechanically securing a male connector directly to the film substrate in electrical contacting relation with a circuit trace. The female connector comprises a pattern smoothly cut through the film substrate defining at least one resilient foldable flap normally restricting passage through the flexible film at the pattern. The at least one foldable flap is adapted to deflect when receiving the male connector in wiping engagement therewith. The female connector further includes a coating of an electrically conductive material on the substrate providing the circuit trace. The coating has an electrical contact land area surrounding the pattern and extending over the foldable flap.

BRIEF DESCRIPTION OF THE DRAWINGS

A more complete understanding of the method and apparatus of the present invention may be obtained by reference to the following detailed description when taken in conjunction with the accompanying drawings wherein.

DETAILED DESCRIPTION OF EMBODIMENTS

Figure 1:
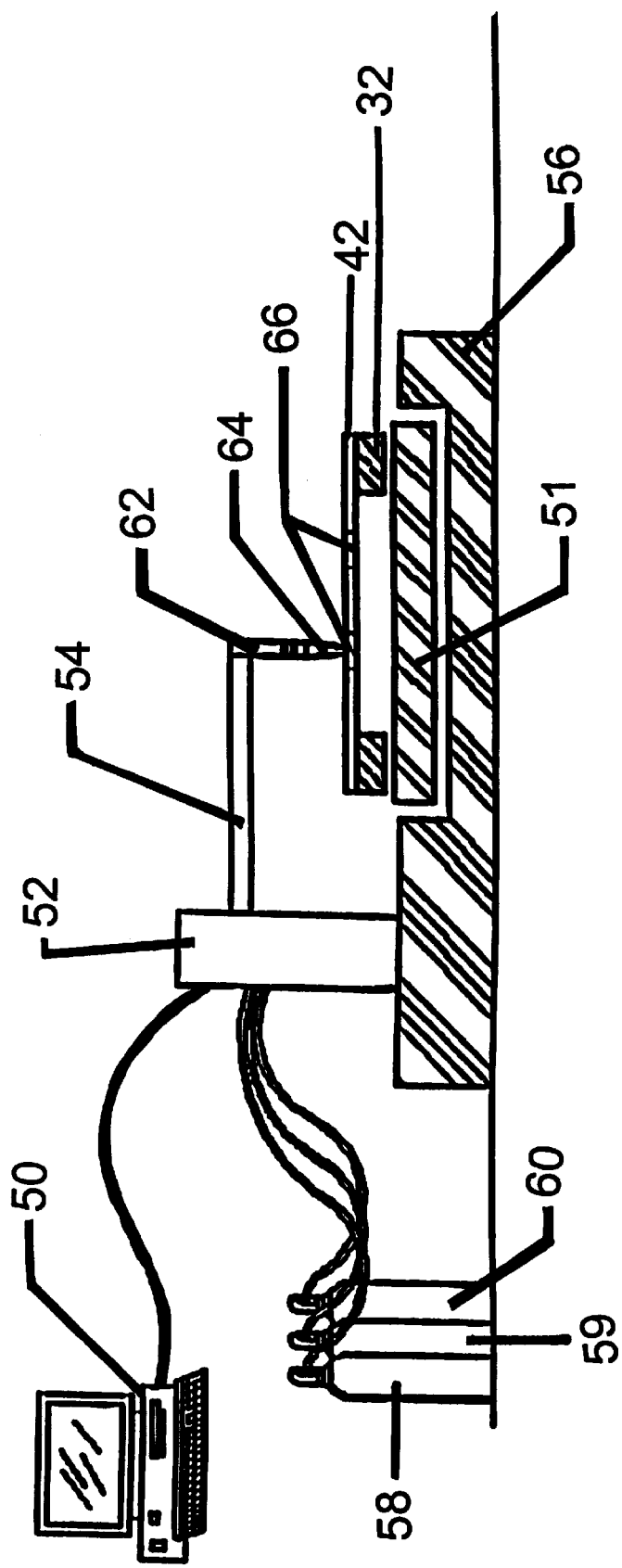
FIG. 1 illustrates the laser pattern cutting step of the present invention.

Referring to the drawings the preferred embodiments of the present invention are described. Throughout the description of the preferred embodiments, reference will be made to cutting of the polyimide material by the use of a $CO_2$ laser. It should be understood that a YAG laser may be used however because the polyimide substrate lends itself to being readily cut by low powered lasers, it is more economical to use a $CO_2$ laser which cost is in the order of magnitude less expensive than a YAG laser.

While the preferred embodiments of the present invention are described with respect to a flexible polyimide film substrate, alternative polymeric materials, such as, for example, some polyesters having characteristics similar polyimide film used in the present invention may be employed for the substrate of the present invention. Preferably, the substrate of the present invention is a flexible polyimide film having a thickness typically in the order of 0.002 to 0.012 inches. A suitable polyimide film is that sold on the market by DuPont under the trade-marks KAPTON® and CIRLEX®. KAPTON is used for thicknesses below 0.007 inches and CIRLEX is used for thicknesses above 0.007 inches. The thickness of the polymide film used is proportional to the size of the male connector.

Referring to FIG. 1, there is shown a laser 52 used to smoothly cut the patterns 66 in the flexible polyimide film substrate 42. The substrate 42 is mounted to a frame 32 and the co-ordinates of the patterns to be cut into the polyimide substrate are fed from computer 50 which controls the operation of $CO_2$ laser 52 and the positioning of computer numerically controlled (CNC) table 51 mounted relative to platform 56.

CNC tables are known in the industry and the schematic representation of the table should be provide a sufficient understanding of the method of making cutting a pattern into the substrate 42. The $CO_2$ laser 52 is mounted upon a table or platform 56 and has a helium tank 58, nitrogen tank 59 and $CO_2$ tank 60. The $CO_2$ laser 52 generates from its laser head 62 a focal beam 64 which cuts into and through the polyimide film 42. The computer 50 controls the laser beam pulse duration, laser beam power, laser pulsing rate, and gas pressure of gas emitted against the surface of the polyimide film 42 where the laser cuts through the film 42. The CNC table typically moves at a speed considerably slower than the pulse rate of the laser beam and hence the speed of movement of the CNC table relative to the pulse rate is not a significant factor. The distance between the laser head 62 and the substrate polyimide film 42 is maintained constant by a mechanical and optical sensing system (not shown) working in conjunction with the computer 50. This maintains the beam power level at an average power level to the area of the polyimide sheet irradiated by the beam as the beam moves across the sheet. As the beam cuts through the film 42 the beam burns a smooth edge along the pattern cut. Consequently, there are no small tears or stress points along the pattern cut in the film 42 which could tear when direct mechanical force is applied to the pattern cut.

Figure 2A:
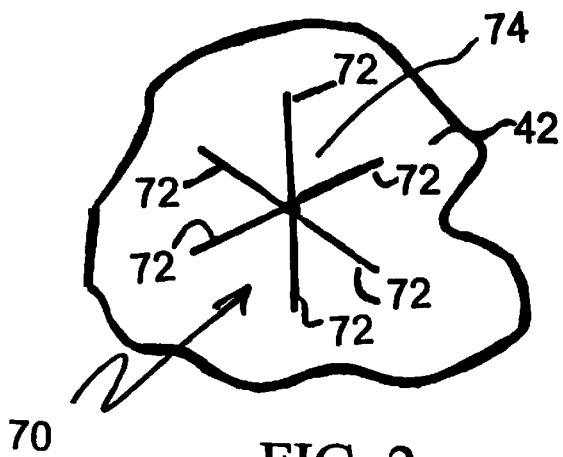
FIG. 2a, 2b, 2c, and 2d represent different patterns that can be cut into the flexible dielectric substrate.
Figure 2B:
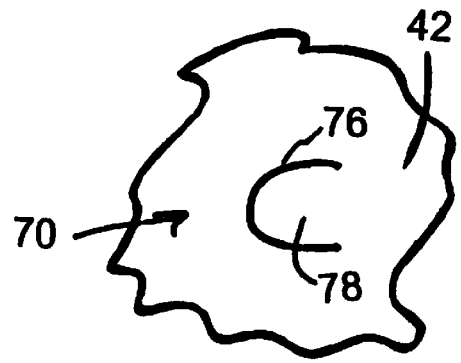
Figure 2C:
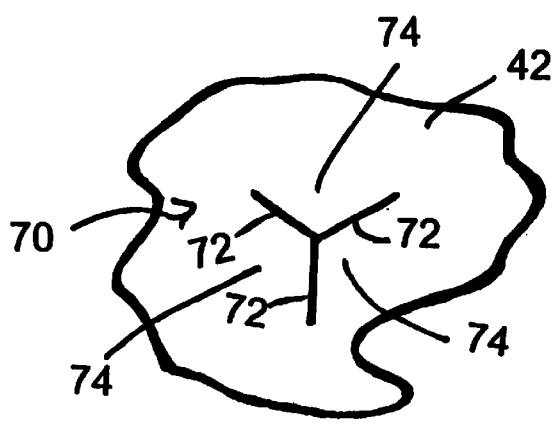

Referring to FIG. 2a, the pattern 70 cut into the substrate 42 is in the form of an asterisk with six legs 72 cut through the substrate 42. Each corresponding adjacent legs 72 define a flap 74. While the legs are shown as single lines, there may be spacing between adjacent flaps 74. In FIG. 2a, the flap has a pie shape. In FIG. 2b, the pattern 70 is made from a semi-circular cut 76 defining a tongue shaped flap 78. In FIG. 2c, the slices 72 cut into the substrate 42 define three flaps 74. In all of these patterns 70, the flaps 74 and 78 normally line in the same plane as the flexible substrate 42 restricting passage through the substrate 42. While the drawings show only one pattern in the substrate, hundreds of patterns may be cut into the flexible circuit with the centers of the patterns cut within 0.04 inches. The size of the diameter of the patterns cut into the flexible substrate 42 may be in the order of 0.03 inches. Hence the use of a laser to cut these patterns quickly into substrate 42 is a preferred cutting mechanism.

Figure 2D:
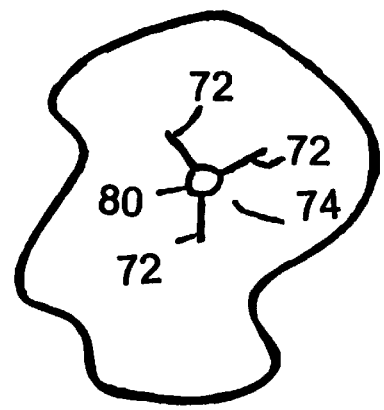

FIG. 2d shows a similar pattern to FIG. 2c, however at the center of the cut is provided an open cut aperture 80. In this embodiment, the flaps 74 normally restrict a portion of the passage to be formed through substrate 42.

Figure 3:
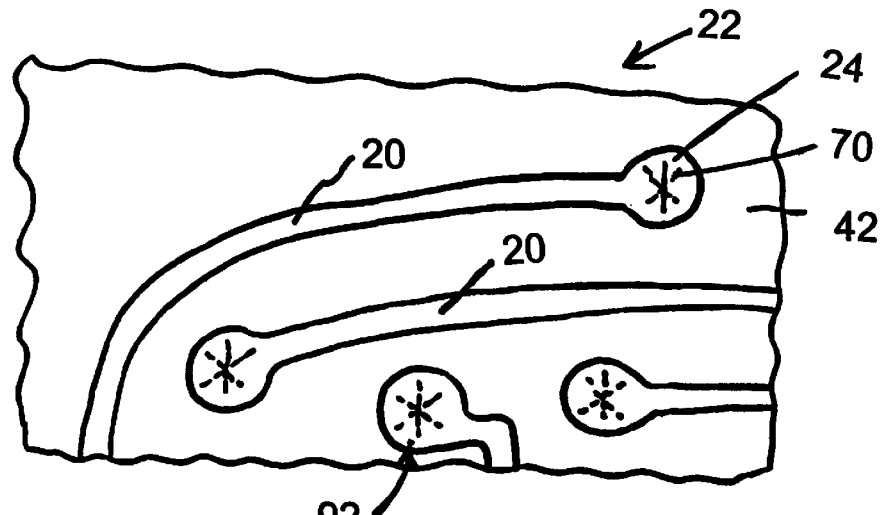
FIG. 3 is a plan view of a flexible dielectric substrate with circuit traces; and, FIGS. 4 and 5 are perspective views showing the connection through the traces and flexible dielectric substrate.

Referring to FIG. 3 substrate 42 is shown having coated thereon traces 20 of electrically conductive material. These traces may comprise a cold or a copper material. The traces may also comprise a conductive ink. Traces 20 are coated onto the substrate 42 to define circuit designs in accordance with the circuit to be implemented by the flexible circuit 22. A land area 24 includes a pattern 70 below the coating similar to the asterisk pattern shown in FIG. 2a. A portion of the substrate 42 is shown and it should be understood at hundreds of traces may be present on the substrate. The land area 24 together with the pattern 70 cut into the substrate forms the female connector designated 92.

Figure 4:
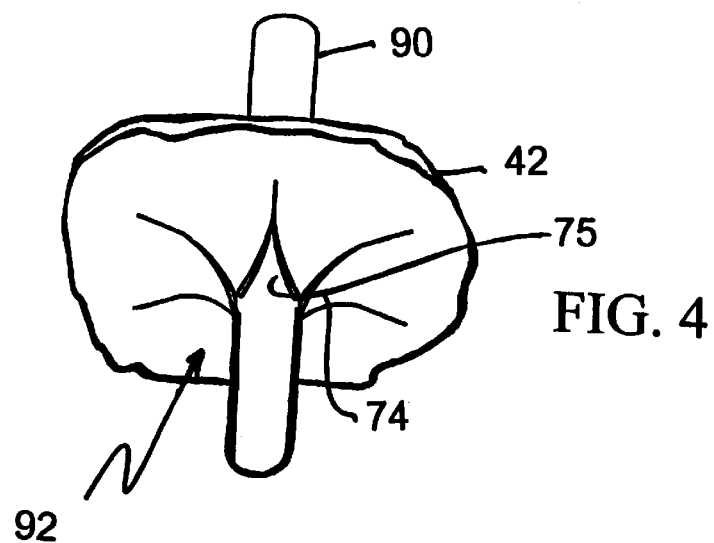
Figure 5:
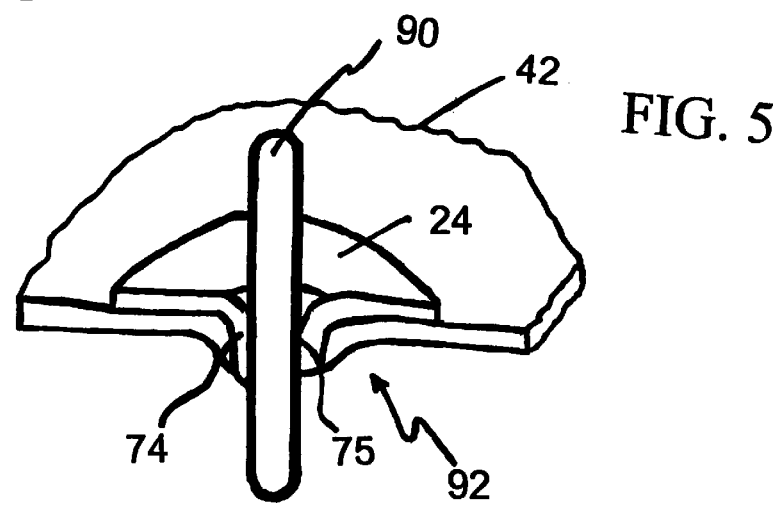

Referring to FIGS. 4 and 5, the male connector or pin terminal 90 is shown to pass through a portion of the substrate 42. A local portion 42 of the substrate is shown for simplicity. As the pin 90 is inserted into the female connector 92, the pin 92 defects the flexible flaps 74. The resilience of the flaps 74 cause flaps 74 to wipe against the pin 90 and mechanically hold the pin 90 in place within the passage 75 defined between the folded flaps 74. The pre-cut patterns 70 allow for the deflection of the flaps 74 with minimal force applied during pin 90 insertion. As better seen in FIG. 5, the conductive land area 24 follows the fold in flap 74 and engages in electrical contact the pin 90. Removal of the pin 90 from substrate 42 results in flaps 74 returning to a position restricting access through, closing the passage 75 in the substrate 42.

Advantage is found with the present invention in that the male connector pin 90, which is cylindrical in shape, is held solely in mechanical and electrical engagement with the trace 24 coated on the substrate 42 and the flaps 74. No other mechanical or chemical fastening is required to maintain the connector pin 90 in the restricted passage opening within the substrate 42. While a pin is shown in the Figures, the pin may represent a terminal of a component or it may represent a terminal connection of wire leading to an interface device. The shape of the pin may be chosen to correspond to the pattern cut into substrate. The need for using ribbon connectors, which require traces to be run to the edge of the flexible circuit, is reduced by the use of the connection of the present invention. Ribbon connectors can still be used with the flexible circuit, however it now becomes a question of design choice and optimization as to where connections to the flexible circuit are to be made.

To improve the pin connection with the flaps, the pin connector preferably has gold plated tip and the area surrounding the pattern on the substrate is preferably gold plated.

As can be seen from FIGS. 4 and 5, as pin 90 passes through substrate 42, a portion of the flaps 24 are deflected. This is because the depth of the edges of the pattern cut into the substrate 42 to form the flaps 74 which is greater than the thickness of the pin 90, also as shown in FIGS. 4 and 5. Consequently, the pin 90 causes deflection of flaps 74 without placing any undue stresses on the ends of the pattern cut into the substrate 42 which could otherwise results in the substrate material tearing.

It should be understood that various alternative embodiments may be readily apparent to a man skilled in the art in view of the teachings as set out here and above.

What is claimed is:

1. A method of manufacturing a female electrical connector in a single layer of a flexible polymeric dielectric film substrate of a flexible circuit ready for mechanically securing a male connector directly to the flexible polymeric dielectric film substrate in electrical contacting relation with a circuit trace, the method comprising the steps of:

directing a laser beam towards the flexible polymeric dielectric film substrate, cutting a smooth pattern through the flexible polymeric dielectric film substrate defining a passage through the flexible polymeric dielectric film substrate, and providing at least one resilient foldable flap positioned to normally close the passage, and coating an electrically conductive material on the flexible polymeric dielectric film substrate providing the circuit trace and providing an electrical contact land area surrounding the pattern extending over the foldable flap and permitting the foldable flap and electrical contact land area to deflect to receive the male connector in wiping engagement therewith.

2. The method of manufacturing a female electrical connector in a single layer of a flexible polymeric dielectric film substrate as claimed in claim 1 comprising the first step of selecting a thickness in the range of 0.002 to 0.012 inches for the flexible polymeric dielectric film substrate.

3. The method of manufacturing a female electrical connector in a single layer of a flexible polymeric dielectric film substrate as claimed in claim 1 comprising the first step of selecting a polyamide film for the flexible polymeric dielectric film substrate.

4. The method of manufacturing a female electrical connector in a single layer of a flexible polymeric film substrate as claimed in claim 1 wherein a $CO_2$ laser is used to cut the pattern.

5. The method of manufacturing a female electrical connector in a single layer of a flexible polymeric dielectric film substrate of claim 1 wherein the step of cutting the pattern into the flexible polymeric dielectric film substrate comprises cutting at least three resilient foldable flaps.

6. The method of manufacturing a female electrical connector in a single layer of a flexible polymeric dielectric film substrate of claim 1 wherein the step of cutting the pattern into the flexible polymeric dielectric film substrate comprises cutting at least five resilient foldable flaps.

7. A method of making in a flexible circuit a wiping connection between a male connector and a female connector in a single layer of a flexible polymeric dielectric film substrate having a thickness of less than 0.012 inches, comprising the steps of:

directing a laser beam towards the flexible polymeric dielectric film substrate, cutting a smooth pattern through the flexible polymeric dielectric film substrate to define a passage extending through the flexible polymeric dielectric film substrate, and providing at least one resilient foldable flap normally closing the passage through the flexible polymeric dielectric film substrate;

coating an electrically conductive material on the flexible polymeric dielectric film substrate including a circuit trace providing an electrical contact land area surrounding the pattern extending over the foldable flap to thereby form the female connector; and, inserting the male connector into the female connector through the flexible polymeric dielectric film substrate at the pattern, and deflecting the foldable flap and conductive coating into wiping electrical and mechanical engagement with the male connector to secure the male connector to the substrate in electrical contact with the trace circuit.

8. The method of claim 7 wherein the male connector comprises a pin.

9. The method of claim 7 wherein a $CO_2$ laser is used to cut the pattern.

10. The method of claim 7 wherein the step of cutting the pattern into the flexible polymeric dielectric film substrate comprises cutting at least three resilient foldable flaps.

11. The method of claim 7 wherein the step of cutting pattern into the flexible polymeric dielectric film substrate comprises cutting at least five resilient foldable flaps.

12. The method of making a flexible circuit as claimed in claim 7 wherein the male connector has a thickness and the step of cutting a smooth pattern involves cutting the pattern to have a width greater than the thickness of the male connector.

* * * * *